(12) United States Patent
Tago et al.

(10) Patent No.: US 9,642,255 B2
(45) Date of Patent: May 2, 2017

(54) MEMBRANE SHEET WITH BUMPS FOR PROBE CARD, PROBE CARD AND METHOD FOR MANUFACTURING MEMBRANE SHEET WITH BUMPS FOR PROBE CARD

(71) Applicant: Elfinote Technology Corporation, Yokohama-shi, Kanagawa (JP)

(72) Inventors: Toshio Tago, Yokohama (JP); Masaaki Ishizaka, Yokohama (JP)

(73) Assignee: Elfinote Technology Corporation, Yokohama-Shi, Kanagawa (JP)

( * ) Notice: Subject to any disclaimer, the term of this patent is extended or adjusted under 35 U.S.C. 154(b) by 0 days.

(21) Appl. No.: 14/128,111

(22) PCT Filed: Dec. 4, 2012

(86) PCT No.: PCT/JP2012/081364
§ 371 (c)(1),
(2) Date: Dec. 20, 2013

(87) PCT Pub. No.: WO2013/084874
PCT Pub. Date: Jun. 13, 2013

(65) Prior Publication Data
US 2014/0327463 A1    Nov. 6, 2014

(30) Foreign Application Priority Data
Dec. 6, 2011 (JP) .................. 2011-266983

(51) Int. Cl.
*H05K 1/11* (2006.01)
*G01R 1/073* (2006.01)
(Continued)

(52) U.S. Cl.
CPC ............ *H05K 1/11* (2013.01); *G01R 1/0408* (2013.01); *G01R 1/0735* (2013.01); *H05K 3/423* (2013.01);
(Continued)

(58) Field of Classification Search
CPC ...... G01R 1/0735; G01R 1/0408; H05K 1/11; H05K 3/423
(Continued)

(56) References Cited

U.S. PATENT DOCUMENTS

2002/0000815 A1* 1/2002 Fjelstad et al. ............... 324/754
2002/0008535 A1* 1/2002 Masuda ........................ 324/765
(Continued)

FOREIGN PATENT DOCUMENTS

JP    07-072171       3/1995
JP    07072171 A *   3/1995 ............... G01R 1/06
(Continued)

OTHER PUBLICATIONS

International Search Report for PCT/JP2012/081364, dated Mar. 12, 2013.
(Continued)

*Primary Examiner* — Son Le
*Assistant Examiner* — Akm Zakaria
(74) *Attorney, Agent, or Firm* — Andrus Intellectual Property Law, LLP

(57) ABSTRACT

A probe card is for testing a wafer which allows for stable contact with electrode pads of a wafer simultaneously under small contact pressure in wafer test procedures. A probe card includes a frame plate which is provided with a plurality of through-holes corresponding to semiconductor chips of a wafer, a wiring substrate, an anisotropic conductive membrane which has a size corresponding to that of the through-hole and is fixed in the through-hole or on a periphery of the through-hole in the frame plate, and a contact membrane which also has a size corresponding to that of the through-hole and is fixed on the periphery of the through-hole in the frame plate. The contact membrane includes an insulating membrane, a conductive electrode provided in the insulating
(Continued)

membrane and on a reverse face of the insulating membrane, and a bump. The bump is formed by plating an upper end of an electrode body which is exposed by half-etching the insulating membrane. The bump has a pointy tip end portion is electrically contacted with a terminal in the wiring substrate via a conductive path in the anisotropic conductive membrane.

12 Claims, 29 Drawing Sheets

(51) Int. Cl.
*G01R 1/04* (2006.01)
*H05K 3/42* (2006.01)
*G01R 1/067* (2006.01)

(52) U.S. Cl.
CPC ..... *G01R 1/06744* (2013.01); *Y10T 29/49165* (2015.01)

(58) Field of Classification Search
USPC .......................................... 324/756, 754, 765
See application file for complete search history.

(56) References Cited

U.S. PATENT DOCUMENTS

| 2006/0076967 | A1* | 4/2006 | Matsuda ........................ 324/754 |
| 2007/0124932 | A1* | 6/2007 | Hosaka .............. G01R 1/06738 29/874 |
| 2007/0205783 | A1* | 9/2007 | Sato et al. ..................... 324/754 |
| 2008/0048686 | A1* | 2/2008 | Sato et al. ..................... 324/754 |
| 2008/0199980 | A1* | 8/2008 | Okayama ........................ 438/16 |
| 2009/0212798 | A1  | 8/2009 | Kasukabe et al. |
| 2010/0301884 | A1  | 12/2010 | Takane et al. |
| 2012/0182035 | A1* | 7/2012 | Rathburn ................. 324/754.03 |

FOREIGN PATENT DOCUMENTS

| JP | 10-178074     | 6/1998  |
| JP | 2003-157918   | 5/2003  |
| JP | 2005338072 A  | 12/2005 |
| JP | 2006-003346   | 1/2006  |
| JP | 2008-089378   | 4/2008  |
| JP | 2011-022001   | 2/2011  |

OTHER PUBLICATIONS

Taiwanese Search Report, Application No. 102120288, date of mailing Oct. 26, 2016.

* cited by examiner

MEMBRANE SHEET WITH BUMPS FOR PROBE CARD, PROBE CARD AND METHOD FOR MANUFACTURING MEMBRANE SHEET WITH BUMPS FOR PROBE CARD

CROSS-REFERENCE TO RELATED APPLICATIONS

This application is the U.S. national stage application of International Application No. PCT/JP2012/081364, filed Dec. 4, 2012, which International application was published on Jun. 13, 2013 as International Publication No. WO 2013/084874 A1 in the Japanese language and which application is incorporated herein by reference. The international application claims priority of Japanese Patent Application No. 2011-266983, filed Dec. 6, 2011, which application is incorporated herein by reference.

TECHNICAL FIELD

The present invention relates to a probe card adapted for testing semiconductor devices or semiconductor chips on a wafer, in particular, to the probe card having a large number of pins allowing for testing individual chips on the wafer simultaneously.

BACKGROUND ART

In the testing process of semiconductor devices or semiconductor chips formed on the wafer, the testing is performed by contacting the probe card with electrode pads of the semiconductor devices on the wafer, and collecting signals applied to them. In the past, for this purpose, testing is performed by contacting a probe card such as a cantilever-type probe card having probe pins made of tungsten and the like or a matrix-type probe card having bent pins made of tungsten and the like with a wafer placed on a stage of a prober device, from above on one segment after another. In the test method by using the conventional probe card, since the probe card can contact only a part of semiconductor chips on the entire wafer, the wafer is displaced by the prober device sequentially so as to contact one segment after another of the entire wafer, thereby testing is performed on the entire wafer.

On the other hand, there is a strong demand to raise the test efficiency by decreasing the number of the segments in a contact operation by employing the probe card having a large number of pins. For example, a probe card of the type having a membrane sheet with bumps disclosed in Patent Document 1 or Patent Document 2 has a structure which can provide such a large number of pins, tens of thousands of pins as to meet such demand.

The first conventional mode, a structure of a probe card of the type having a membrane sheet with bumps as disclosed in Patent Document 1 will be explained with reference to FIG. 16. In FIG. 16, reference numeral 201 represents a bumped membrane (membrane sheet with bumps), which is formed by providing bumps 207, short-circuit portions 209 and reverse-face side electrode portions 211 on a polyimide sheet (insulating membrane) 205 which is mounted and spread out on a rigid ring 203. The bumps 207 serve to contact with electrode pads which are lead terminals on the wafer. Reference numeral 213 represents an anisotropic conductive membrane which is constructed by providing an elastic membrane 215 made of rubber material with conductive paths 217 which provide electrical interconnection through the thickness of the conductive paths 217 by compressing the conductive paths 217 in a direction of the thickness thereof. The anisotropic conductive membrane 213 serves to absorb difference in height among the electrode pads of the wafer and among the bumps 207, and to apply contact pressures to the bumps 207, evenly. Reference numeral 219 represents a wiring substrate which comprises an insulating substrate 221 of 3 to 5 mm thickness as a base member, terminals 223, external terminals 225, and lead wires 227 connecting between the terminals 223 and the external terminals 225, respectively. The wiring substrate 219 serves to lead signals which are transmitted from the bumps 207 to the terminals 223 via the conducting paths 217 to the outside. Here, the bumps 207, the short-circuit portions 209, the reverse-face side electrode portions 211, the conductive paths 217 and the terminals 223 are provided in positions corresponding to the electrode pads which serve as lead terminals on the wafer under test (more specifically in the positions coincident with the electrode pads in a horizontal position), and several thousands to tens of thousands of sets are prepared as needed.

Then, the method for producing the bumped membrane 201 is explained with reference to FIGS. 17 to 19. First, a member comprising a copper foil 229 of about 18 μm thickness and a polyimide sheet 205 of about 25 μm thickness affixed to the copper foil 229 is prepared. As shown in FIG. 17, small-diameter holes 231 of about 30 μm diameter are formed in the polyimide sheet 205 by irradiating the polyimide sheet 205 with laser (the first step). Next, a protective resist 233 is applied to the reverse side of the copper foil 229, and nickel electroplating is performed by connecting a plating electrode to the copper foil 229. The nickel is plated in such a manner as to fill in the small-diameter holes 231 to form the short-circuit portions 209. After reaching the surface of the polyimide sheet 205, nickel plating spreads uniformly to all directions into a hemisphere, thereby forms the bump 207 (the second steps, refer to FIG. 18). The nickel plating is performed until each bump 207 reaches 10 to 20 μm in height. Then the protective resist 233 applied to the reverse side of the copper foil 229 is stripped, another resist is applied again to the reverse side of the copper foil 229, and a pattern for the reverse-face side electrode portions is exposed on the resist. The reverse-face side electrode portions 211 are formed by etching the copper foil 229. Then the resist is removed, and the polyimide sheet 205 is affixed to the rigid ring 203, thereby the bumped membrane 201 is completed (the third step, refer to FIG. 19).

Next, the second conventional mode, the structure of the probe card of the type including a membrane sheet with bumps as disclosed in Patent Document 2 is described with reference to FIGS. 20 to 29.

This probe card has a frame plate 301 shown in FIG. 20. The frame plate 301 has a diameter of 200 mm to 300 mm which is almost equal to a diameter of a wafer under test, and a thickness, for example, of about 40 μm to 80 μm. And, the frame plate 301 has a thermal expansion coefficient or linear thermal expansion coefficient close to that of the wafer in order to avoid influence of positional misalignment accompanied by temperature change. The frame plate 301 has the thermal expansion coefficient or linear thermal expansion coefficient, for example, of 0 to $1 \times 10^{-5}/°$ C. Further, the frame plate 301 has a plurality of through-holes or through-bores 303 penetrating through in a thickness direction of the frame plate 301. The through-holes or through-bores 303 are formed in the frame plate 301 by etching so as to correspond to the semiconductor chips formed on the wafer.

FIG. 21 shows a structure of an area of the through-hole 303 formed in the frame plate 301, and an anisotropic conductive membrane 305 and a contact membrane (membrane sheet with bumps) 307 are supported by and mounted on a periphery of through-hole 303. The anisotropic conductive membrane 305 comprises an elastic membrane 309 and conductive paths 311 provided in the elastic membrane 309, this elastic membrane 309 is made of rubber material and has 80 µm thickness. An outer periphery (313) of the elastic membrane 309 is fixed to a periphery of the through-hole 303 on the frame plate 301, and the elastic membrane 309 serves to retain the conductive paths 311.

The conductive path 311 comprises a part of 130 µm thickness in an elastic membrane and a large number of metal particles contained in the part, therefore comes to have an electric conductivity in upward and downward directions due to contacts among the metal particles contained in the conductive path 311 as a result of deformation of the conductive path 311 when a load is applied to the conductive path 311 in a thickness direction of the conductive path 311.

On the other hand, the contact membrane 307 comprises an insulating membrane 315, bumps 317 formed on a face side of the insulating membrane 315 and conductive electrodes 319. The insulating membrane 315 is made of polyimide and has 25 µm thickness. A peripheral portion or a reverse face of the peripheral portion of the insulating membrane 315 is fixed to the frame plate 301 with an adhesive 321. The insulating membrane 315 is provided with the bumps 317 on the face side of the insulating membrane 315, and each bump 317 is made of nickel and is about 20 µm in diameter as well as in thickness. The bump 317 serves to contact with an electrode pad of the semiconductor chip on the wafer. Further, the insulating membrane 315 is provided with conductive electrodes 319 in a surface of the insulating membrane 315 and in the insulating membrane 35, each leads to the bump 317. The conductive electrodes 319 serve to connect between the bump 317 and the conductive path 311 in the anisotropic conductive membrane 305. Reference numeral 323 represents a wiring substrate having a large diameter corresponding to the wafer, and the wiring substrate 323 comprises a 3 to 5 mm thick insulating substrate 325 which is a base member, terminals 327, external terminals 329 and lead wires 331, and serves to lead signals which are transmitted from the bump 317 to the terminal 327 via the conductive electrode 319 and the conductive path 311, to the outside through the external terminal 329.

Now, the method for producing the contact membrane 307 is described below, with reference to FIGS. 22 to 29.

In FIG. 22, reference numeral 333 represents a ply sheet, in which a large number of the contact membranes 307 are to be formed. FIG. 23 is a view showing a cross-section of the ply sheet 333, and the ply sheet 333 comprises a 25 µm thick polyimide sheet 335 to provide the insulating membranes 315 and a 4 µm thick copper foil 337 affixed thereto. Then, a resist 339 is applied to the ply sheet 333, and a pattern for the conductive electrodes are formed on the resist 339 by using photo-masking process to form the conductive electrodes on positions corresponding to the electrode pads of semiconductor chips on the wafer. And the ply sheet 333 is dipped in a polyimide etching solution, and conductive electrode holes 341 are formed in the polyimide sheet 335 (333) by using the pattern formed in the resist 339 as masking (the first step, refer to FIG. 24). In this case, as shown in FIG. 24, due to anisotropic properties of the polyimide, a cone-shaped hole (a hole with trapezoidal cross-section) with a sidewall angle of 50° relative to a face of the ply sheet 333 is etched gradually in the ply sheet 333. Then, the resist 339 is stripped, nickel plating is carried out by using the copper foil 337 as a plating electrode, nickel is deposited in the conductive electrode holes 341 about to the thickness of the polyimide sheet 335, and thereby the conductive electrodes 319 are formed, as shown in FIG. 25 (the second step). After the conductive electrodes 319 are formed, another resist 342 is applied to the copper foil 337, bump holes 343 are formed in the resist 342 by photo-masking process in order to form bumps 317 in positions corresponding to the electrode pads of the semiconductor chips (the third step, refer to FIG. 26). Furthermore, as shown in FIG. 27, nickel plating is carried out by using the copper foil 337 as a plating electrode, and nickel is deposited in the bump holes 343 to a height which does not exceed to the thickness of the resist 342, thereby the bumps 317 are formed (the fourth step). Then, the resist 342 is stripped, another resist 345 is applied, and a pattern is formed in the resist 345 by using photo-masking process. The polyimide sheet 335 in this condition is dipped in an etching solution for etching copper, the copper foil 337 is etched away, thereby formed is each conductive electrode base 347 in a periphery of each bump 317. The conductive electrode base 347 serves as a part of the conductive electrode 319 (the fifth step, FIG. 28). Afterwards, the resist 345 is stripped, and rectangular parts as in FIG. 22 are cut out and separated from the polyimide sheet 335 to obtain individual contact membranes 307. Then, non-defective contact membranes 307 are sorted out of the obtained contact membranes 307, and each of the non-defective membranes 307 is applied with the adhesive 321 as shown in FIG. 29, and is mounted on the frame plate 301 with respect to each through-hole 303 by using a mounting device as shown in FIG. 21. Finally, the frame plate 301 is entirely placed on the wiring substrate 323 or on a face side of the wiring substrate 323, thereby the probe card is completed.

PRIOR ART DOCUMENTS

Patent Documents

Patent Document 1: JP-A, 10-178074
Patent Document 2: JP-A, 2011-022001

SUMMARY OF INVENTION

Problem to be Solved by the Invention

In the structure of a probe card shown in the first conventional mode, a large pressure is required for contact of the probe card with the electrode pads of the wafer since the bumps are in the form of hemisphere and have tips which are not pointed.

In the structure of the probe card shown in the second conventional mode, different from the probe card of the first conventional mode, the bumps are in the form of a square cylinder or a circular cylinder. Here, it is possible to obtain the bump with a fine tip by forming the bump so as to have the same small sectional area along its entire length, but it is not possible to narrow only the tip portion of the bump. Therefore, in view of ensuring the strength of the entire bump, it is virtually impossible to provide the bump with a pointed tip portion. Even in the probe card of the second conventional mode, a large pressure is required for contact of the probe card with the electrode pads of the wafer.

The present invention is made in order to solve such conventional problems, and it is an object of the present invention to provide a probe card having a large number of bumps which allows the bumps to successfully contact with electrode pads of a wafer simultaneously under small pressure, a membrane sheet with bumps adapted to the probe card, and a method for producing the membrane sheet with bumps.

Means for Solving Problem

In order to achieve the foregoing object, provided is a following membrane sheet with bumps adapted for a prove card according to the present invention. The membrane sheet with bumps comprises an insulating membrane, a bump provided on a face of the insulating membrane so as to electrically contact with an electrode pad of a semiconductor chip formed on a wafer, and a conductive electrode extending from the bump to a reverse face side of the insulating membrane through the insulating membrane. A portion of the conductive electrode located in the insulating membrane has a cross-section of a trapezoid that decreases in width toward the face of the insulating membrane, and the bump has a triangular cross-section and includes a bottom face larger than an upper face (a face) of the conductive electrode. The upper face of the conductive electrode is, for example, integral with the bottom face of the bump. Since the bump is formed into a shape of triangular cross-section, such as a cone or a pyramid (for example, a four-sided pyramid), the tip portion of the bump is pointed, and such bumps are allowed to electrically contact with the electrode pad of the wafer under a small pressure successfully. In addition, the bump has a sectional area that gradually becomes large towards a bottom face side of the bump, which can ensure overall sufficient strength of the bump. And, since the conductive electrode has a trapezoidal cross-section that decreases in width toward the face of the insulating membrane, the conductive electrode is restricted from movement in a direction toward the face side of the insulating membrane. In addition, the bump has a bottom face which is larger than the upper face of the conductive electrode, the conductive electrode is restricted from movement also in a direction toward the reverse face of the insulating membrane by contact or engagement of the outer side of the bottom face of the bump with the insulating membrane. The upper face of the conductive electrode is located, for example, on the same level with the face of the insulating membrane.

The conductive electrode of the membrane sheet with bumps for a probe card may be provided with a reverse-face-side end portion protruding from the reverse face of the insulating membrane, and the reverse-face-side end portion may be formed larger than a bottom face (reverse face) of a portion of the conductive electrode which is located in the insulating membrane. The reverse-face-side end portion is, for example, integral with the bottom face of the portion of the conductive electrode which is located in the insulating membrane. In such construction, effects of preventing the conductive electrode from escaping in the direction toward the face of the insulating membrane is enhanced by contact or engagement of an outer side of the reverse-face-side end portion with the reverse face of the insulating membrane.

Such membrane sheet with bumps is assembled with a wiring substrate having terminals which are electrically connected with conductive electrodes, thereby a probe card is constructed.

The membrane sheet with bumps may have a size corresponding to that of the wafer, for example, a size equal to or substantially equal to that of the wafer.

The probe card may have a frame plate provided with a plurality of through-holes which correspond to semiconductor chips. The membrane sheet with bumps may have a size corresponding to that of the through-hole, and may be supported on a periphery of the through-hole on a face side of the frame plate. Here, an anisotropic conductive membrane may be used. The anisotropic conductive membrane comprises an elastic membrane which has a size corresponding to that of the through-hole and a plurality of conductive paths provided in the elastic membrane in electrically insulated relation to one another and extend in a thickness direction of the elastic membrane. The elastic membrane is supported in the through-hole or on the periphery of the through-hole. The conductive electrode may be electrically connected with a terminal of the wiring substrate via each of the conductive paths.

In addition, according to the present invention, provided is a following method for producing a membrane sheet with bumps for a probe card. The membrane sheet comprises an insulating membrane, a bump provided on a face of the insulating membrane so as to electrically contact with an electrode pad of a semiconductor chip formed on a wafer, and a conductive electrode extending from the bump to a reverse face side of the insulating membrane through the insulating membrane. The method comprises a step of preparing an insulating sheet for forming the insulating membrane, a step of forming a plating hole with a triangular cross-section in the insulating sheet from a reverse face of the insulating sheet so as to correspond to the electrode pad of the semiconductor chip, a step of forming an electrode body by plating the plating hole wherein the electrode body has a shape corresponding to a shape of the plating hole and includes a lower end (a proximal end with respect to a reverse face thereof) which forms the conductive electrode, a step of half-etching a face side of the insulating sheet and exposing an upper end (a proximal end with respect to a face thereof) of the electrode body relative to the lower end which forms the conductive electrode from the insulating sheet wherein the upper end of the electrode body protrudes with a shape having a triangular cross-section from the insulating sheet, and a step of plating a surface of the upper end of the electrode body which protrudes with a shape having the triangular cross-section from the insulating membrane to form the bump wherein the bump includes a surface following the surface of the upper end of the electrode body which is exposed by half-etching the insulating sheet. The plating hole has a leading end which is sharp, for example, pointy. Since the bump has a surface which follows the surface of the electrode body with triangular cross-section, the bump has a pointed tip, and since the bump is formed by plating the surface of the electrode body which protrudes from the insulating membrane, the bottom face of the bump is larger than an upper face of the conductive electrode. The bump is formed, for example into a shape with a triangular cross-section. The electrode body (the upper end of the electrode body) with a triangular cross-section which protrudes from the insulating membrane forms an inner portion of the bump. Further, in the step of forming the electrode body, the electrode body may be formed in such a manner that the electrode body has a reverse-face-side end portion larger than a bottom face of a portion of the electrode body located in the insulting membrane and the reverse-face-side end portion protrudes from a reverse face of the insulating membrane.

Effects of the Invention

According to the present invention, the tip of the bump is pointed since the bump is, for example, in the form of a cone or a pyramid with triangular cross-section, therefore the pressure required for the bump to contact with the electrode pad of the wafer is small, the pressure needed for stable contact is, for example, equal to or less than half the pressure required in the conventional modes. This facilitates simple construction of the structure of a probe card required for extending the life of an anisotropic conductive membrane and required for contacts of a large number of pins.

In addition, since the insulating membrane is sandwiched by the bottom face (outer periphery of the bottom face) of the bump and a slant surface of the conductive electrode, and the outer surface layer of the bump is joined with a large area of the upper end of the electrode body, even when the pressure is unevenly applied to the bumps, the bumps are firmly fixed relative to the insulating membrane in upward and downward directions as well as a lateral direction. As a result, the bump does not come off or is not broken, that is to say, the bump is not damaged, and this leads to the advantage of decreasing the yield loss due to the problems involved in strength of bumps.

MODE FOR CARRYING OUT THE INVENTION

The first embodiment (a first probe card) of the present invention is explained with reference to FIGS. 1 to 14 as below. The first probe card comprises a frame plate having contact membranes, anisotropic conductive membranes and a wiring substrate.

Figure 1:
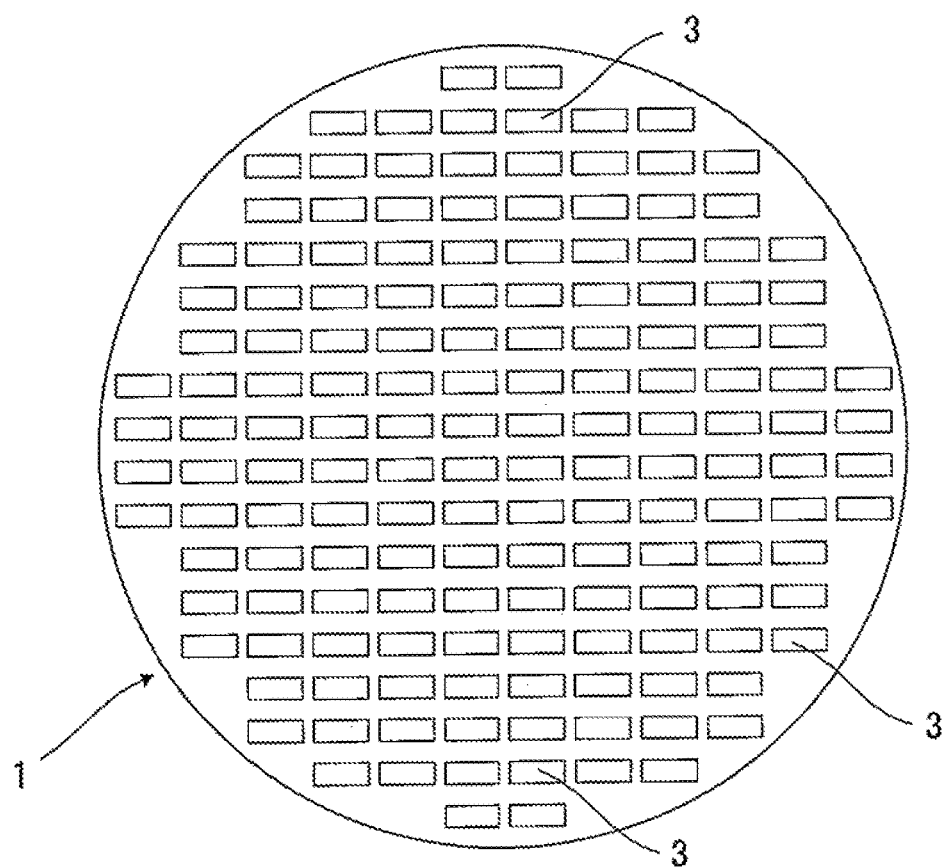
FIG. 1 is a view showing a frame plate in a first embodiment of the present invention.

In FIG. 1, reference numeral 1 represents the frame plate adapted for the first probe card, the frame plate 1 has a diameter of 200 mm to 300 mm, which is generally equivalent to that of a wafer (semiconductor wafer) under test, and has a thickness, for example, of 40 μm to 80 μm. In order to avoid possible influence of misalignment associated with temperature changes, the frame plate 1 has a coefficient of thermal expansion or coefficient of thermal linear expansion which is close to that of the wafer, and the flame plate has, for example, the coefficient of thermal expansion or coefficient of thermal linear expansion of 0 to $1\times10^{-5}/°$ C. Therefore, for the frame plate 1, metallic materials such as inbar and 42alloy are suitable. In addition, the frame plate 1 is provided with a plurality of or a large number of through-holes 3 which penetrate through the frame plate 1 in a direction of the thickness of the frame plate 1 so as to correspond to semiconductor chips formed in the wafer. These through-holes 3 are formed by etching. Here, the single through-hole 3 corresponds to a single semiconductor chip, the single-through-hole 3 may correspond to a few semiconductor chips or two to five semiconductor chips.

Figure 2A:
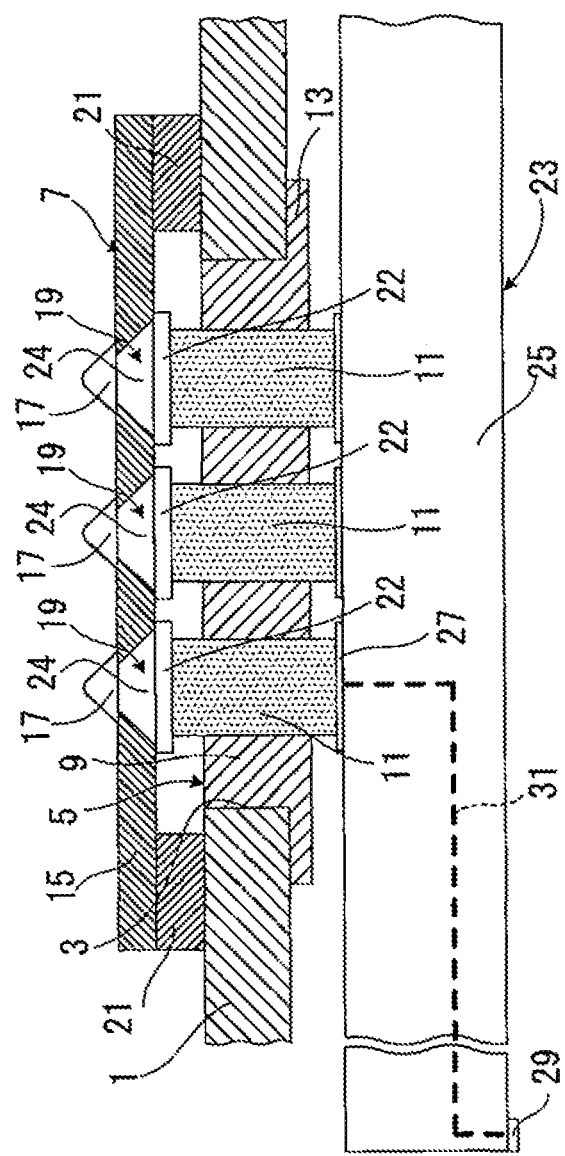
FIG. 2A is a cross-sectional view showing a structure of a probe card in the first embodiment of the present invention.
Figure 2B:
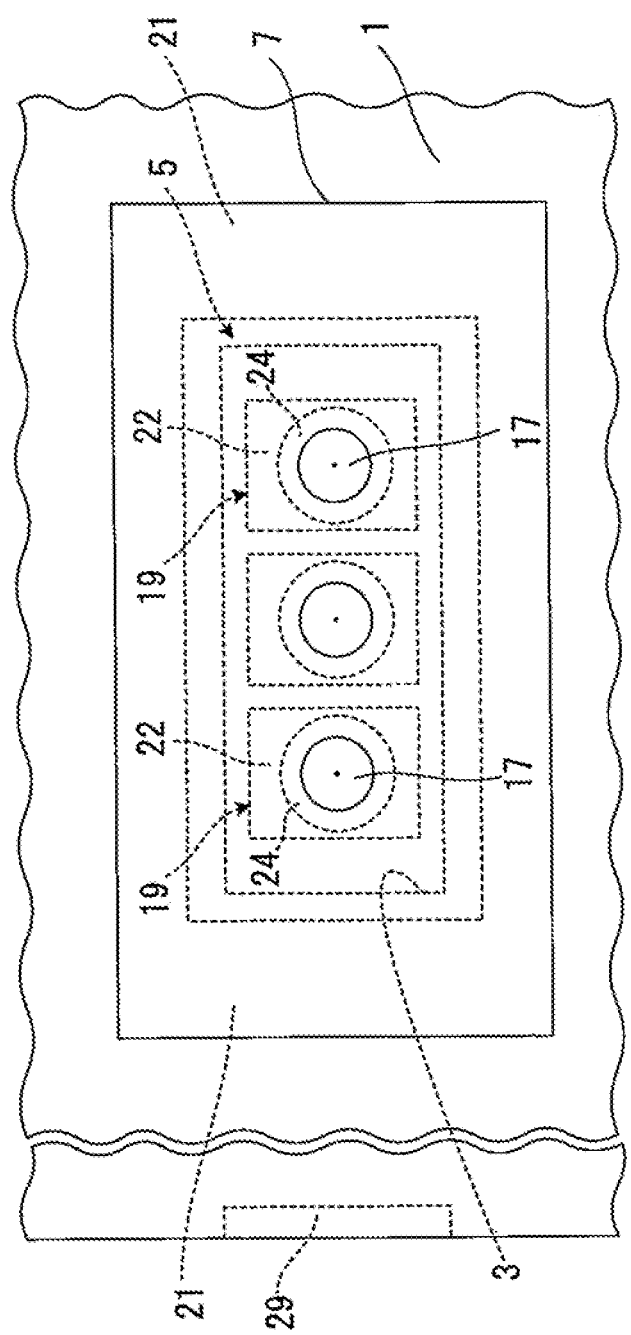
FIG. 2B is a plan view showing the structure of the probe card in the first embodiment of the present invention.

Then, with reference to FIG. 2, a structure of the first probe card for which the frame plate 1 is used is described.

FIG. 2 shows the structure of an area of the through-hole 3 formed in the frame plate 1, and in this structure the anisotropic conductive membrane 5 and the contact membrane (a membrane sheet with bumps) 7 are disposed while supported by the periphery of the through-hole 3. Thus, the anisotropic conductive membrane 5 and the contact membrane 7 each has a size corresponding to that of the through-hole (through-bore) 3 or a size corresponding to that of a semiconductor chip. The structure as shown in FIG. 2 is constructed for each of the through-holes 3 in the frame plate 1. The anisotropic conductive membrane 5 comprises an elastic membrane 9 and conductive paths 11 provided in the elastic membrane 9. The elastic membrane 9 is made of a rubber material and has 80 μm thickness, an outer circumference of the elastic membrane 9 is fixed on the periphery of the through-hole 3 in the frame plate 1, and the elastic membrane 9 serves to hold the conductive paths 11. The lower end of the outer circumference (a reverse side of the outer circumference) of the elastic membrane 9 is provided integrally with an outwardly directed support flange 13, and the elastic membrane 9 is fitted in the through-hole 3, for example, tightly, in such a manner that the support flange 13 is placed on and supported by a reverse face of the frame plate 1 at the outer circumference of the through-hole 3.

The conductive path 11 comprises a 130 μm thick portion in the elastic membrane and the portion contains a large number of metal particles. When a pressure is applied to the conductive path 11 in a direction of a thickness thereof, the conductive path is deformed, then the metal particles in the conductive path 11 contact with one another, thereby the conductive path 11 has an electric conductivity in upward and downward directions. That is to say, the conductive path 11 is formed so as to have protruding portions (which are in the form of square (rectangular) column at upper and lower sides (upper face side and reverse face side) of the elastic membrane 9, the protruding portions may be in the form of circular cylinder) and then provide 130 μm thick portions in parts of the electric membrane 9.

On the other hand, the contact membrane 7 comprises an insulating membrane 15, bumps 17 provided on a face of the insulating membrane 15, and conductive electrodes 19 provided in the insulating membrane 15 and on the reverse face of the insulating membrane 15. The insulating membrane 15 is made of polyimide and has 20 μm thickness. A peripheral portion or a reverse face of the peripheral portion of the insulating membrane 15 is fixed on the flame plate 1 (a face of the flame plate 1 at an outer circumference of the anisotropic conductive membrane 5) by an adhesive 21. The bumps 17 are formed from nickel on the face of the insulating membrane 15, each bump is in the form of cone which is about 20 μm in height as well as in radius at a bottom face of the cone, and serves to contact with an electrode pad of the semiconductor chip in a wafer. The conductive electrodes 19 are provided in the insulating membrane 15 and on the reverse face of the insulating membrane 15 and are continuous to the bumps 17. The conductive electrode 19 includes a lower end portion (a reverse-face-side end portion) 22 which is equal to or larger than the conductive path 11 of the anisotropic conductive membrane 5 in area. The conductive electrode 19 includes a reverse end face which is exposed at a reverse face of the insulating membrane 15 and serves to connect the bump 17 and the conductive path 11 of the anisotropic conductive membrane 5. A portion 24 of the conductive electrode 19 located in the insulating membrane 15 is in the form of a circular truncated cone shape (trapezoidal cross-section), and the reverse-face-side end portion 22 is thin-walled, in the form of a rectangular shape. The reverse-face-side end portion 22 is larger than a bottom face of the portion 24 of the conductive electrode 19 located in the insulating membrane 15. Reference numeral 23 represents a wiring substrate having a large diameter corresponding to that of the wafer and that of the frame plate 1, and the wiring substrate 23 comprises an insulating substrate 25 with a thickness of 3 to 5 mm as a base member, terminals 27, external terminals 29 positioned on one end of the base member, and lead wires 31. The lead wires 31 serve to lead signals which are transmitted from the bumps 17 to the terminals 27 via the conductive electrodes 19 and the conductive paths 11, to the outside through the external terminals 29. Here, the bumps 17, the conductive electrodes 19, the conductive paths 11 and the terminals 27 are provided so as to coincident with the electrode pads of the semiconductor chips which serve as leading terminals on the wafer under test in the horizontal position, and several thousands or several tens of thousands of those are prepared as needed.

Next, the method for producing the contact membrane 7 is explained with reference to FIGS. 3 to 12. Since the contact membrane 7 is small in size, the contact membrane 7 is not required to have a coefficient of thermal expansion (coefficient of thermal linear expansion) equal to that of the wafer (specifically, the contact membrane 7 has the coefficient of thermal expansion greater than that of the wafer), therefore, the contact membrane 7 can be made from a readily processable material at low cost.

Figure 3:
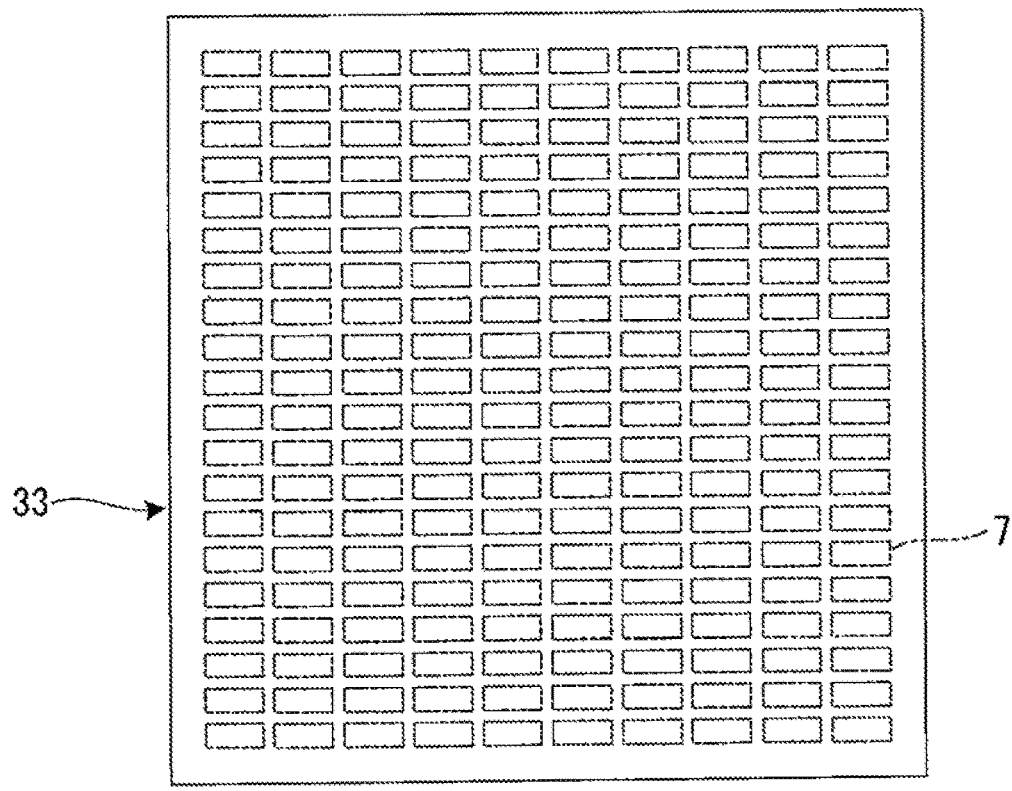
FIG. 3 is a view showing a ply sheet in the first embodiment of the present invention.
Figure 4:
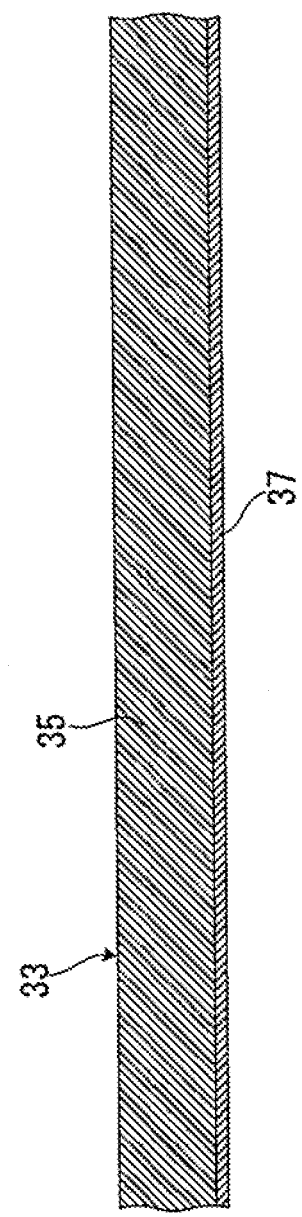
FIG. 4 is a cross-sectional view showing the ply sheet in the first embodiment of the present invention.
Figure 5:
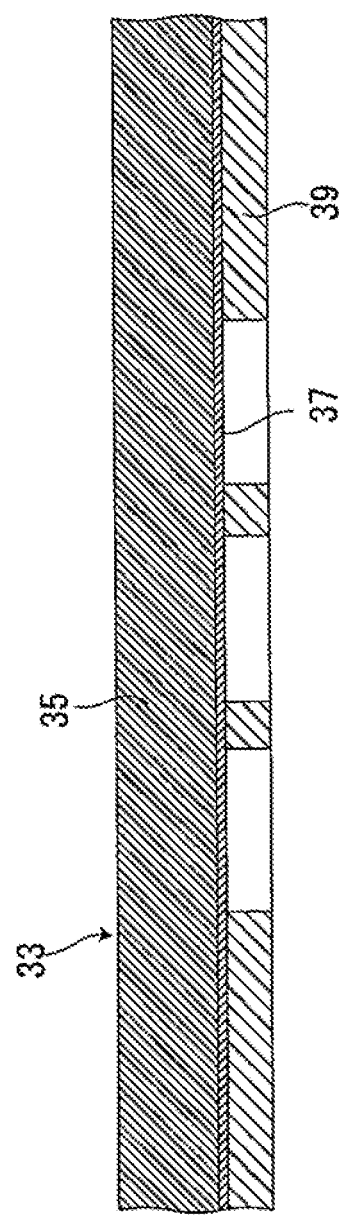
FIG. 5 is a view showing a second step of a method for producing a contact membrane in the first embodiment of the preset invention.
Figure 6:
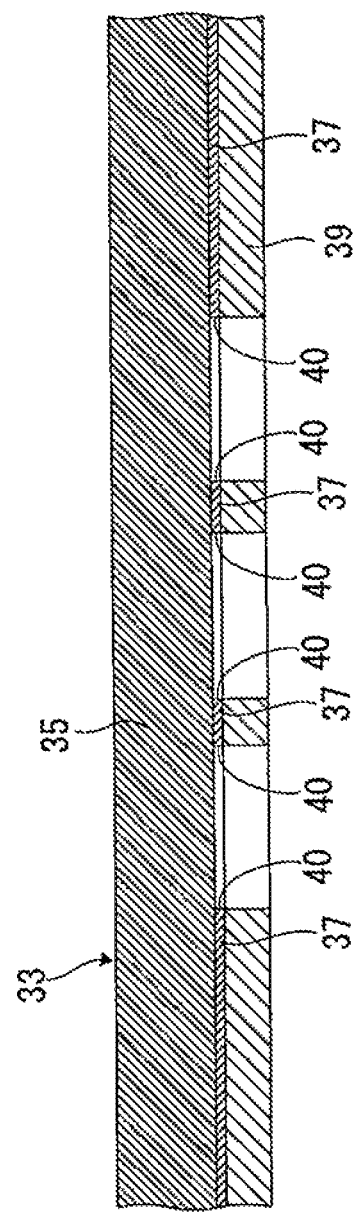
FIG. 6 is a view showing a third step of the method for producing the contact membrane in the first embodiment of the preset invention.
Figure 7:
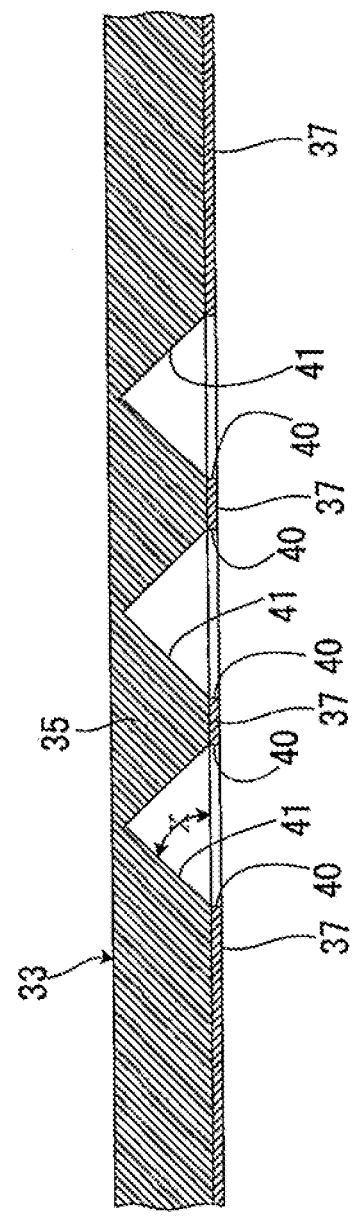
FIG. 7 is a view showing a fourth step of the method for producing the contact membrane in the first embodiment of the preset invention.
Figure 8:
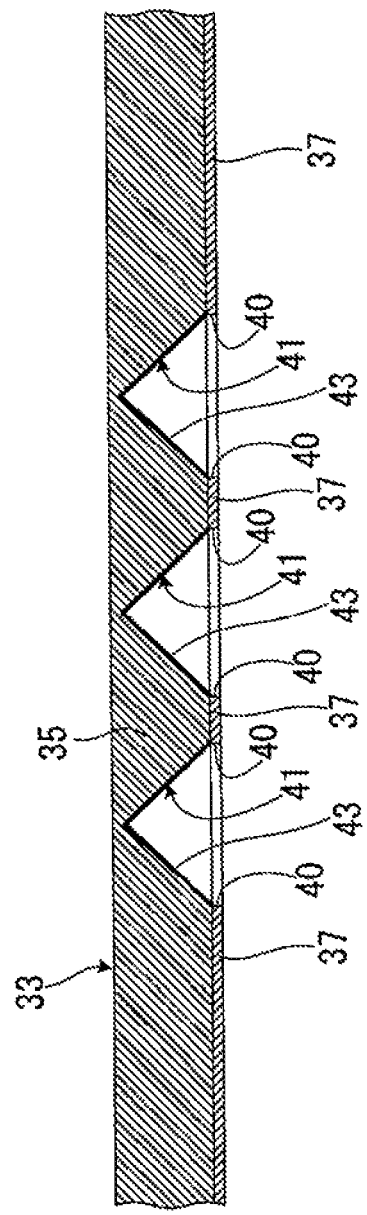
FIG. 8 is a view showing a fifth step of the method for producing the contact membrane in the first embodiment of the preset invention.
Figure 9:
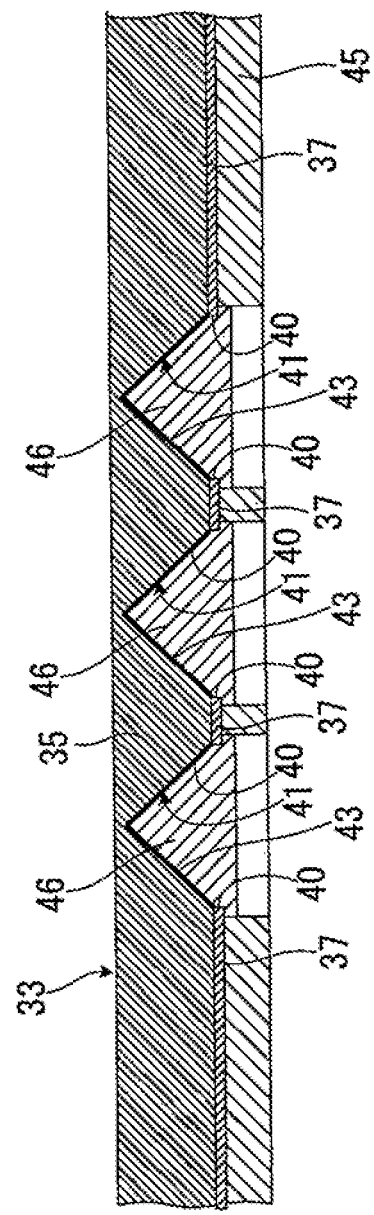
FIG. 9 is a view showing a sixth step of the method for producing the contact membrane in the first embodiment of the preset invention.
Figure 10:
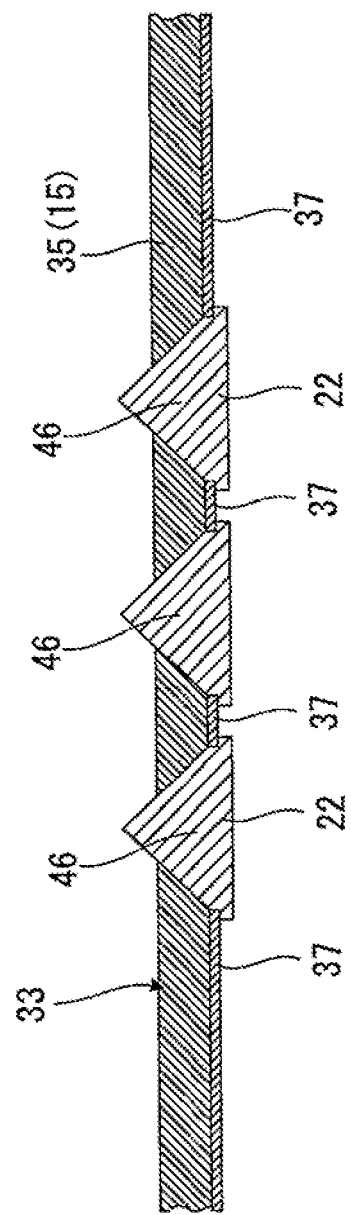
FIG. 10 is a view showing a seventh step of the method for producing the contact membrane in the first embodiment of the preset invention.
Figure 11:
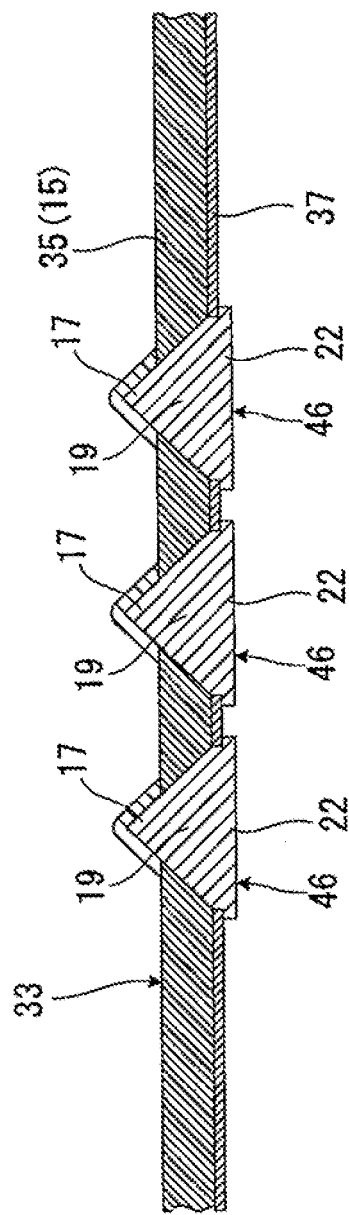
FIG. 11 is a view showing an eighth step of the method for producing the contact membrane in the first embodiment of the preset invention.

In FIG. 3, reference numeral 33 represents a ply sheet, and a large number of the contact membranes 7 are formed in the ply sheet 33. In this case, the contact membranes 7 are produced more than the required number of the contact membranes 7 to be mounted on the frame plate 1, however, since the contact membranes 7 are produced with a higher density per a unit area of the ply sheet (at a narrower pitch) 35, the entire ply sheet 33 is smaller than the frame plate 1 in size, namely, a smaller square of about 200 mm on a side, and a surface of the ply sheet 33 may be easily and accurately patterned with resist and plated by an ordinary device. FIG. 4 shows a cross-section of the ply sheet (a portion to form a single contact membrane 7), and the ply sheet 33 is formed by affixing a 4 μm thick copper foil 37 to a 38 μm thick polyimide sheet (insulating sheet) 35 which serves as an insulating membrane 15 or forms the insulating membrane 15 (the first step, a preparing step). In the second step of producing the contact membrane 7, a resist 39 is coated on the copper foil 37, and a pattern is formed in the resist 39 by using a photo-mask in order to form conductive electrodes on positions corresponding to or equivalent to electrode pads of the semiconductor chip formed on the wafer (refer to FIG. 5). Further, in the third step, circular holes 40 are formed in the copper foil 37 by dipping the ply sheet 33 in a copper etching solution, using the pattern formed in the resist 39 as a mask (refer to FIG. 6). Next, in the fourth step, the resist 39 is stripped, conductive electrode holes (plating holes) 41 are formed in the polyimide sheet 35 from a reverse face side thereof corresponding to the circular holes 40 in the copper foil 37, by dipping the ply sheet 33 masked by the copper foil 37 in a polyimide etching solution which is composed primarily of hydrazine (a step of forming the plating holes, refer to FIG. 7). Here, in this case, due to anisotropic properties of the polyimide, etching progresses so as to form a cone-shaped hole at an angle (X, here, angle of 50°) with respect to a face of the sheet. The ply sheet 33 is dipped in the polyimide etching solution for a long time such that the leading end of the conductive electrode hole 41 is made pointed, for example, acute, and conductive electrode hole 41 defines totally a cone or pyramid shape (triangular cross-section). The angle of the conductive electrode hole 41 with respect to the face of the sheet is varied according to the crystal structure of the polyimide. For example, when the angle (X) is 50° with respect to the face of the sheet and a diameter of a circular hole of the pattern formed in the resist 39 is 56 µm, the conductive electrode hole 41 has a diameter of 56 µm at a bottom thereof (an aperture on the reverse face) and a height measured from the bottom to the tip thereof is 33.3 µm. Next, in a fifth step, as shown in FIG. 8, a thin copper film 43 is formed in the conductive electrode hole 41 by sputtering copper from the reverse face of the ply sheet 33. Then, in a sixth step, after another resist 45 is affixed to the copper foil 37 and the pattern for the conductive electrode is formed in the resist 45 by using photo-masking, nickel plating is carried out by using the thin copper film 43 as a plating electrode, nickel is deposited in the conductive electrode holes 41 roughly to the thickness of the polyimide sheet 35 or roughly to the middle of the resist 45, each electrode body 46 (a lower end of the electrode body 46 forms the conductive electrode 19) is formed (a step of producing the electrode body, refer to FIG. 9). Here, a part of the resist 45 to form the conductive electrode 19 is larger than the bottom of the conductive electrode hole 41 in area. Then, in a seventh step, the resist 45 is stripped, the polyimide sheet 35 is dipped in an etching solution from a face side of the ply sheet 33, and a half-etching is conducted until the thickness of the polyimide sheet 35 becomes 20 µm and a tip end of the electrode body 46 is exposed (a step of exposure, refer to FIG. 10, the thin copper film 43 is not specifically shown distinctively in some Figs. such as FIG. 10). As described above, when the conductive electrode hole 41 has a height of 33.3 µm from its bottom to its tip, the exposed portion of the conductive electrode body 46 is 13.3 µm in height. The insulating membrane 15 or a set of the insulating membranes 15 is made by half-etching the polyimide sheet 35. Next, in an eighth step, as shown in FIG. 11, the exposed portion of the electrode body 46 on its tip end is nickel-plated by using the copper foil 37 as an electrode to form a bump (a step of forming bumps). The bump 17 to be formed has a surface corresponding to a surface of the exposed portion of electrode body 46, and has a shape of a cone or a triangular cross-sectional shape. Specifically, the cross-sectional shape may be a triangle with a round shape top corner, or a triangle with an arcuate top corner or a small arcuate top corner (a top corner shaped of a circular arc with a small curvature radius), or a triangle with a small rounded top corner, but in any case, the cross-sectional shape is pointy.

Figure 12:
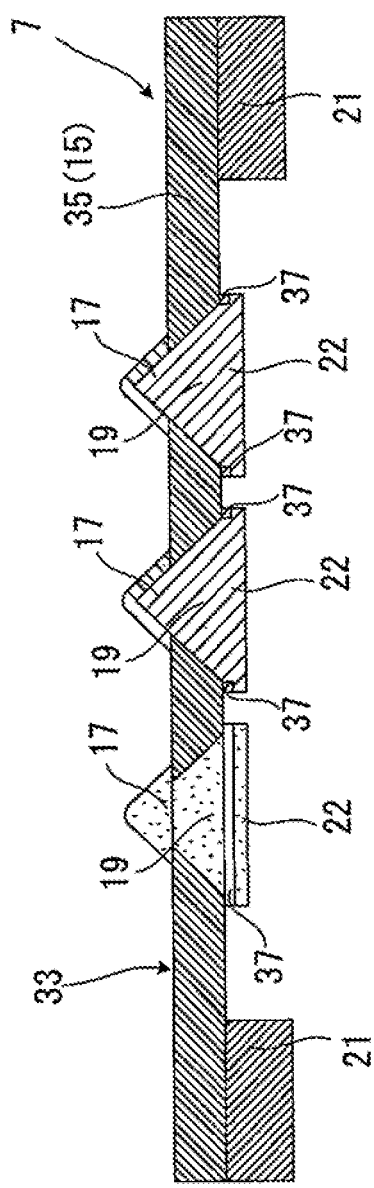
FIG. 12 is a view showing a step for applying an adhesive in the method for producing the contact membrane in the first embodiment of the present invention.
Figure 13:
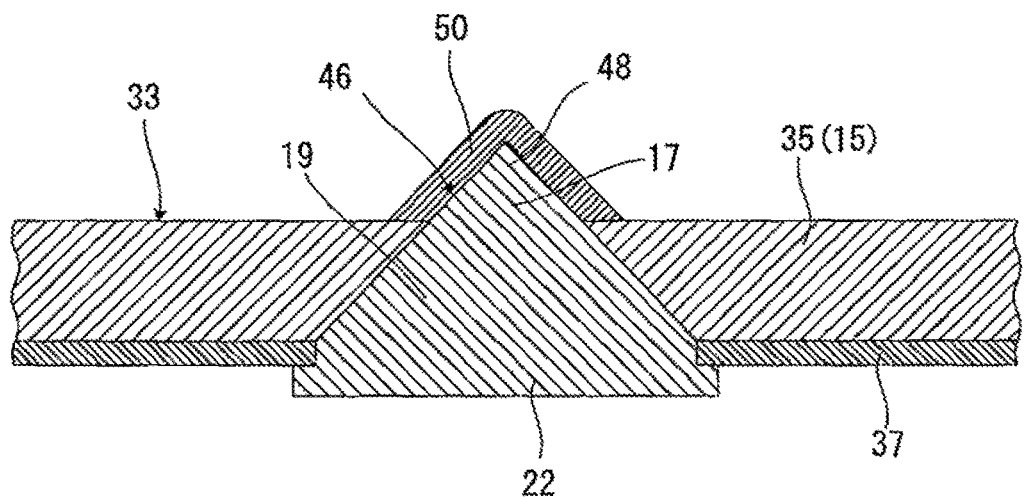
FIG. 13 is a view showing a shape of a bump with a plating thickness of 5 μm in the first embodiment of the present invention.
Figure 14:
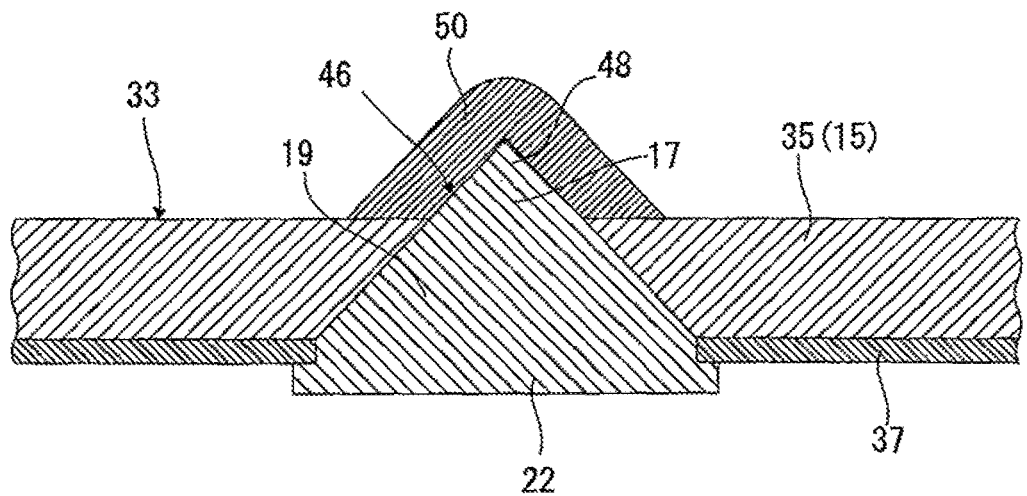
FIG. 14 is a view showing a shape of a bump with a plating thickness of 10 μm in the first embodiment of the present invention.

The shapes of the bump 17 and the conductive electrode 19 which are formed are shown in detail in FIGS. 13 and 14. FIG. 13 shows details of the bump 17 formed with a plating thickness 5 µm (FIG. 13 shows details of the bump 17 indicated in FIGS. 11 and 12). The portion of the electrode body 46 on its tip end is exposed by half-etching the polyimide sheet 35, then the nickel plating is carried out to the exposed portion 48 of the electrode body 46 on its tip end. In the process of the nickel plating, the plating is deposited perpendicular to a face of the exposed portion 48 to form a plated portion 50. The plated portion 50 comprises a tip end portion which has a spherical shape with its center at a tip of the exposed portion 48, and a portion other than the tip end portion which has a uniform thickness following a surface of the exposed portion 48. The bump 17 has a triangular cross-section with a small arc-like top corner.

Moreover, FIG. 14 shows details of the bump 17 formed with a plating thickness 10 µm (FIG. 14 shows a case that the nickel plating is carried out until the plated portion of FIG. 11 has the thickness of 10 µm). Similarly to the structure shown in FIG. 13, at a tip end portion, a plated portion 50 is formed into a spherical shape with its center at the tip of the exposed portion 48, and the bump 17 has a triangular cross-section with an arc-like top corner which is larger than that shown in FIG. 13. In such a structure, the polyimide sheet 35 (an insulating membrane 15 or a set of the insulating membranes 15 formed by half-etching the polyimide sheet 35) is sandwiched by the conductive electrode 19 with a trapezoidal cross-section and the bump 17 of which diameter is enlarged by the plated portion 50, whereby the bump 17 and the conductive electrode 19 are firmly fixed to the polyimide sheet 35 or the insulating membrane 15, respectively. The plating thickness preferably ranges from 5 µm to 10 µm. When the plating thickness is smaller than 5 µm, the above fixing strength is reduced, and when the plating thickness is larger than 10 µm, the degree of pointedness of the tip of the bump 17 is lowered due to an enlarged arc-like profile of the tip of the bump 17. Lastly, the copper foil 37 is stripped by etching, individual rectangular parts in FIG. 3 are cut away and separated to form individual contact membranes 7. As shown in FIG. 12, the adhesive 21 is applied to non-defective contact membranes 7 which are sorted out of the above contact membranes 7. By using an assembling machine, the non-defective contact membranes 7 are mounted on the frame plate 1 across the through-holes 3 thereof where the anisotropic conductive membranes 5 are provided, as shown in FIG. 2 (in FIG. 2A, the copper foil 37 is not specifically shown distinctively), and finally, the entire frame plate 1 is mounted on the wiring substrate 23 or on a surface side of the wiring substrate 23, thereby the probe card is completed.

In the first conventional method for producing bumps, short-circuit portions and reverse-face electrode portions, residues tend to remain in holes formed in a polyimide sheet. Here, however, since the holes formed in the polyamide sheet according to the embodiment have large diameters compared to the holes formed in the polyimide sheet according to the first conventional method, it is easy to plate the holes, and the bumps and the conductive electrodes may be produced in a higher yield. That is to say, in the first conventional method, since the holes in the polyimide sheet are bored by laser, the holes have small diameters, therefore, residues tend to remain in such small-diameter holes in a processing process, which often results in defective deposition of plating and therefore defective bumps.

The probe card is put on a prober device, aligned to and pressed against the wafer under test. Then the bumps 17 contact against the electrode pads of the wafer under pressure, the pressure is applied to the conductive paths 11 of the anisotropic conductive membrane 5 via the conductive electrodes 19, and signals output by contact with the electrode pads of the wafer are transmitted to the external terminals 29 via the bumps 17, the conductive electrodes 19, the conductive paths 11, the terminals 27 and the lead wires 31.

Now, the second embodiment (a second probe card) of the present invention is explained with reference to FIG. 15.

Figure 15:
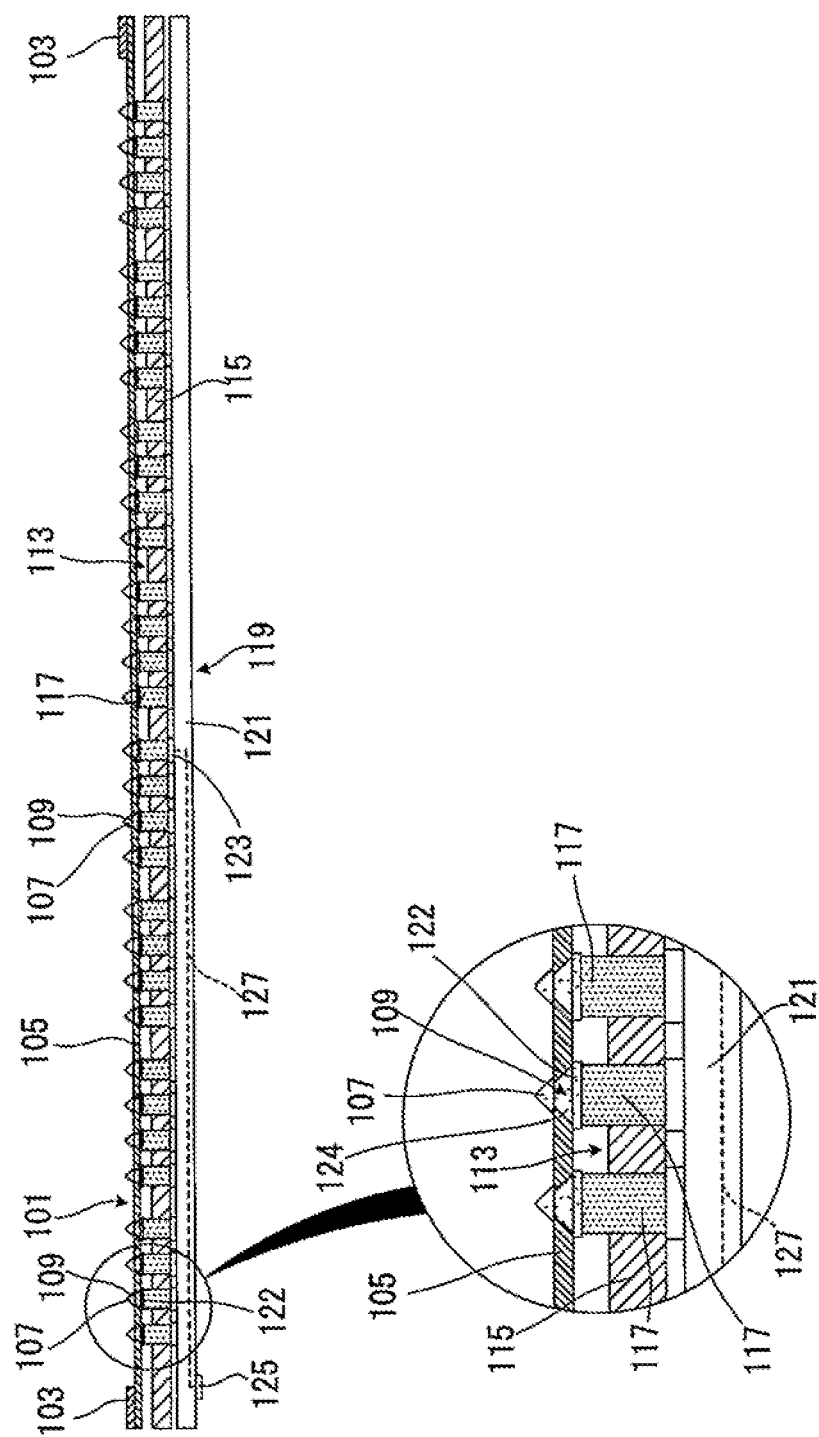
FIG. 15 is a cross-sectional view showing a structure of a probe card in the second embodiment of the present invention.
Figure 16:
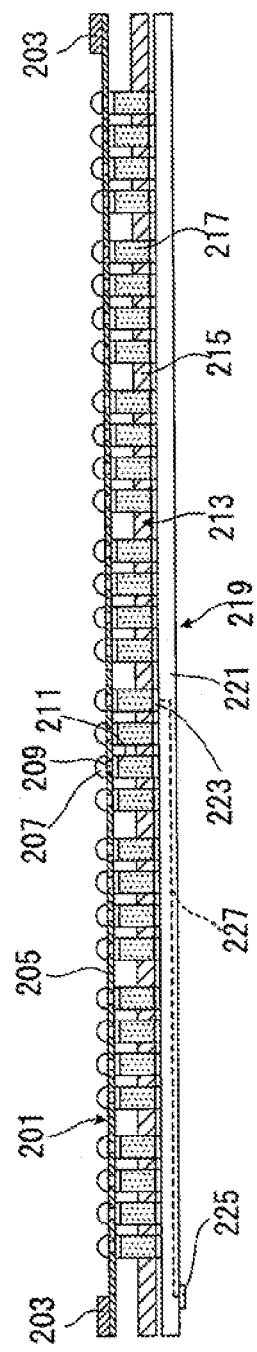
FIG. 16 is a cross-sectional view showing a structure of a probe card in the first conventional mode.
Figure 17:
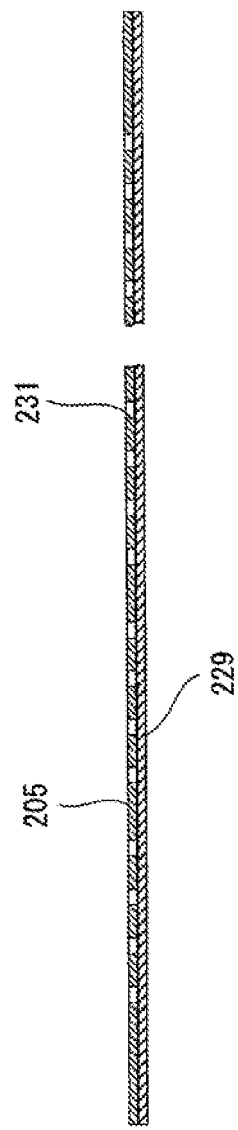
FIG. 17 is a view showing a first step of a method for producing a bumped membrane in the first conventional mode.
Figure 18:
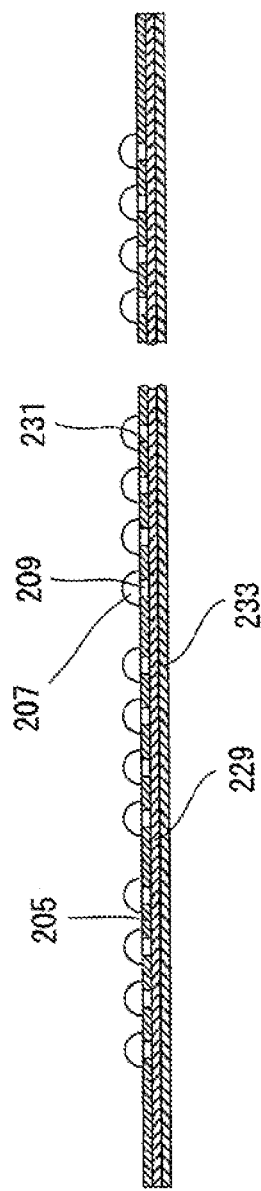
FIG. 18 is a view showing a second step of the method for producing the bumped membrane in the first conventional mode.
Figure 19:
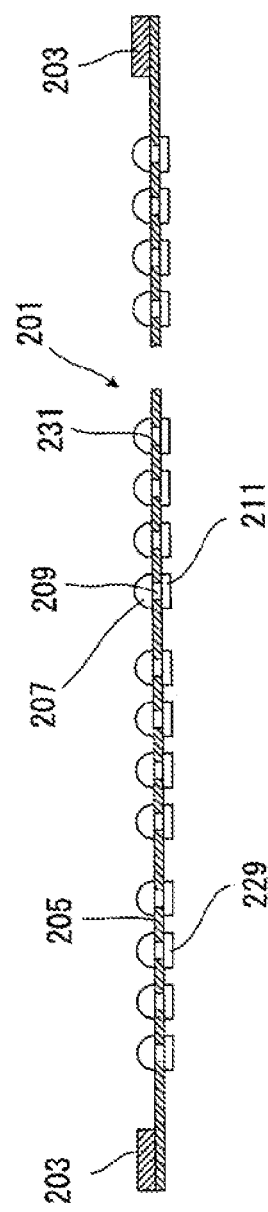
FIG. 19 is a view showing a third step of the method for producing the bumped membrane in the first conventional mode.
Figure 20:
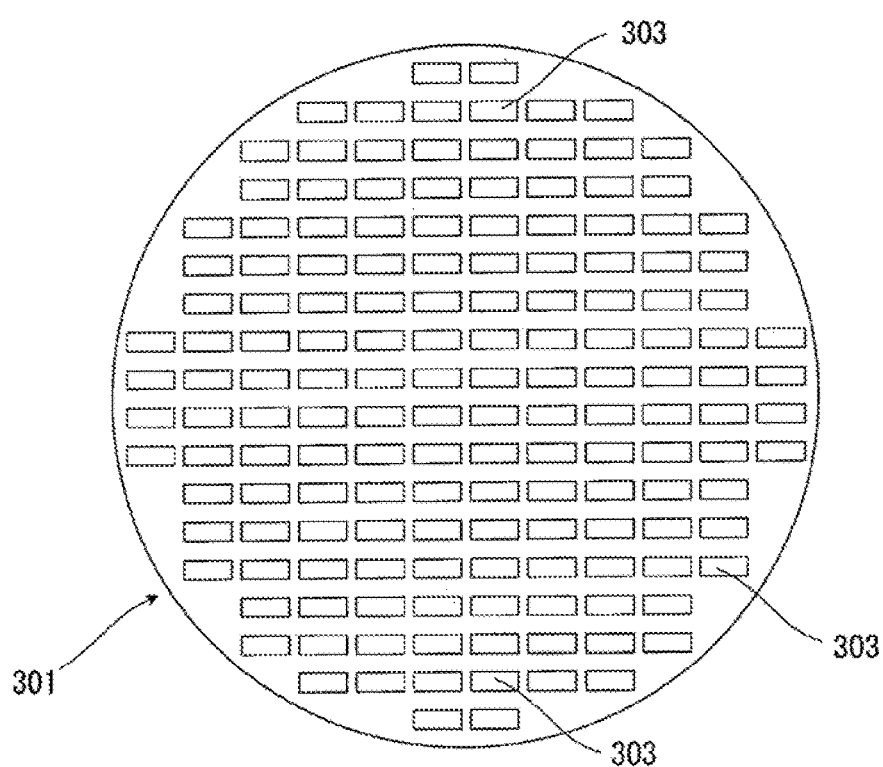
FIG. 20 is a view showing a frame plate in the second conventional mode.
Figure 21:
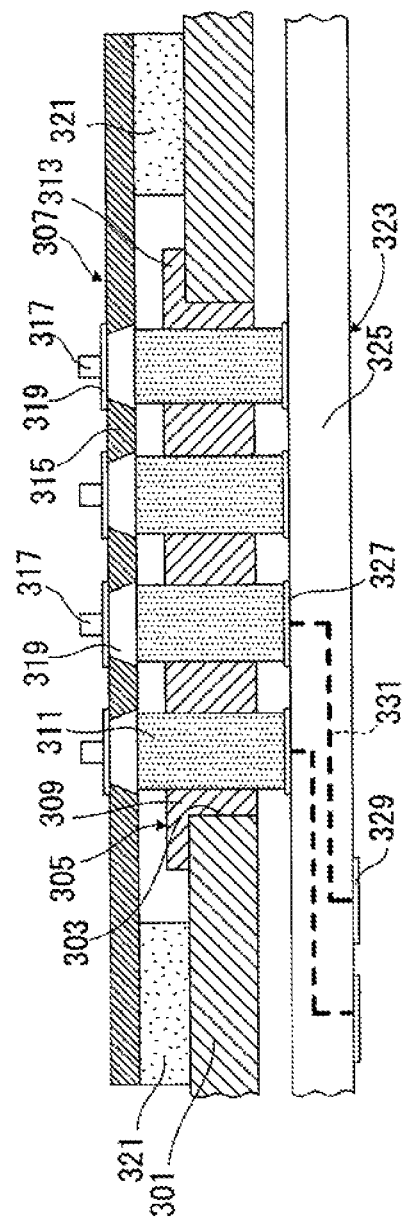
FIG. 21 is a cross-sectional view showing a structure of a probe card in the second conventional mode.
Figure 22:
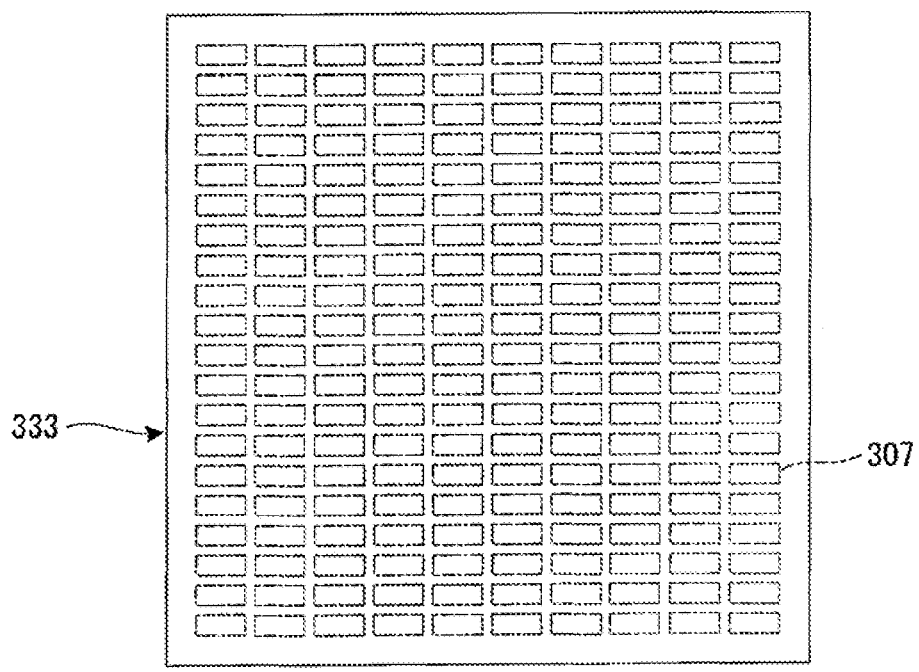
FIG. 22 is a view showing a ply sheet in the second conventional mode.
Figure 23:
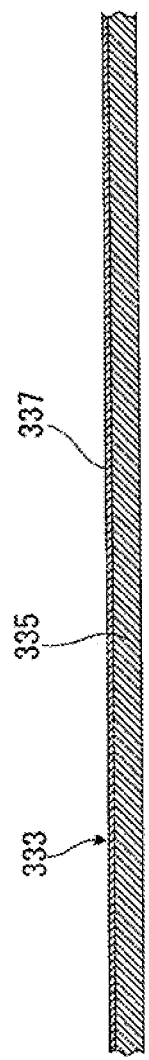
FIG. 23 is a cross-sectional view showing the ply sheet in the second conventional mode.
Figure 24:
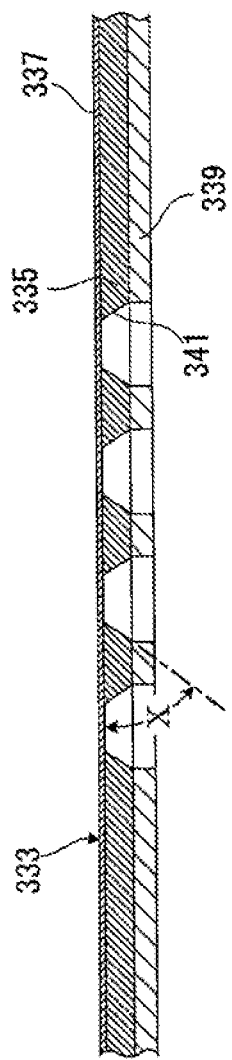
FIG. 24 is a view showing a first step of a method for producing a contact membrane in the second conventional mode.
Figure 25:
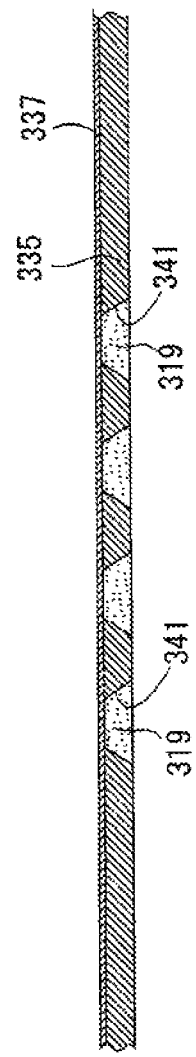
FIG. 25 is a view showing a second step of the method for producing the contact membrane in the second conventional mode.
Figure 26:
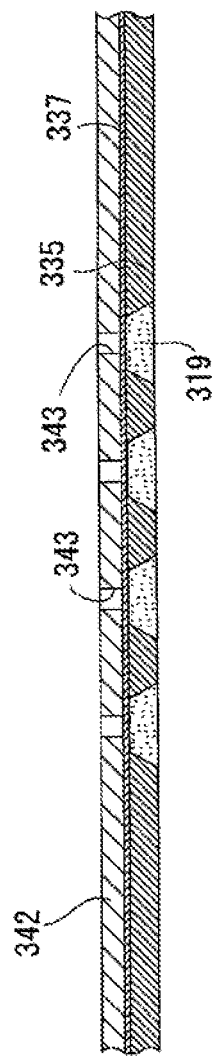
FIG. 26 is a view showing a third step of the method for producing the contact membrane in the second conventional mode.
Figure 27:
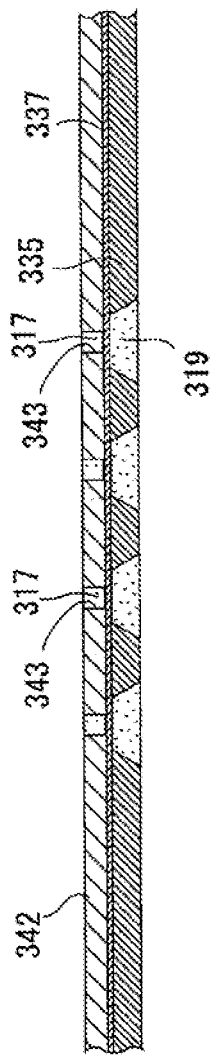
FIG. 27 is a view showing a fourth step of the method for producing the contact membrane in the second conventional mode.
Figure 28:
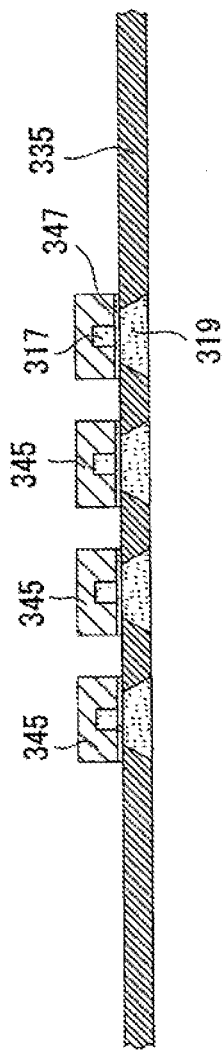
FIG. 28 is a view showing a fifth step of the method for producing the contact membrane in the second conventional mode.
Figure 29:
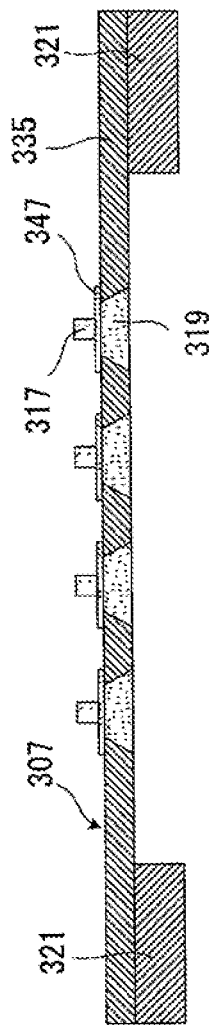
FIG. 29 is a view showing a step of applying an adhesive in the method for producing the contact membrane in the second conventional mode.

In FIG. 15, reference numeral 101 represents a bumped membrane (membrane sheet with bumps) which comprises a polyimide sheet (insulating membrane) 105 which is placed and spread out on a rigid ring 103, and the polyimide sheet 105 is provided with bumps 107 and conductive electrodes 109 (the conductive electrodes 109 include portions 124 located in the polyimide sheet 105 and reverseface-side end portions 122). The bumps 107 serve to contact with electrode pads which serve as lead terminals on the wafer. Reference numeral 113 represents an anisotropic conductive membrane which is constructed by forming conductive paths 117 in an elastic membrane 115 made of rubber material. When the conductive path 117 is compressed in a direction of a thickness thereof, the conductive path 117 has an electric conductivity in a direction of a thickness thereof. The anisotropic conductive membrane 113 serves to absorb difference in height among the electrode pads of the wafer, the bumps 107, and the like, and to apply contact pressures to the bumps 107, evenly. Reference numeral 119 represents a wiring substrate which comprises an insulating substrate 121 of 3 to 5 mm thickness as a base member, terminals 123, external terminals 125, and lead wires 127 connecting between the terminals 123 and the external terminals 125, respectively. The wiring substrate 119 serves to lead signals which are transmitted from the bumps 107 to the terminals 123 via the conductive paths 117 to the outside. Here, the bumps 107, the conductive electrodes 109, the conductive paths 117 and the terminals 123 are formed in positions corresponding to the electrode pads which serve as lead terminals on the wafer under test (more specifically, in the positions coincident with the electrode pads in a horizontal position), and several thousands to tens of thousands of sets are prepared as needed. The bumps 107 and the conductive electrodes 109 have the same configuration and structure as the bumps 17 and the conductive electrodes 19 in the first embodiment.

The bumped membrane 101 is produced basically by the same method as the contact membrane 7 in the first embodiment. However, since the bumped membrane 101 has a size corresponding to that of the wafer, a ply sheet 33 to be prepared should have a size sufficient to fabricate the bumped membrane 101 having the size corresponding to the wafer. A single insulating membrane 105 is made from an entire polyimide sheet (insulating sheet) 35 of the ply sheet 33. The ply sheet 33 here has the same cross-section as that in the first embodiment shown in FIG. 4, and is constructed by affixing a 4 µm thick copper foil 37 to a 38 µm thick polyimide sheet 35. The single bumped membrane 101 is made from the entire ply sheet 33 through the same steps as the second, third, fourth, fifth, sixth, seventh and eighth steps in the first embodiment. After the eighth step is completed, finally, similarly to the method in the first embodiment, the copper foil 37 is stripped by etching. Then, the completed single polyimide sheet 105 with bumps is adhered to the rigid ring 103 to fabricate the bumped membrane 101, the anisotropic conductive membrane 113 is placed on the wiring substrate 119 or on a surface side of the wiring substrate 119, and then, the above-mentioned bumped membrane 101 is placed above the anisotropic conductive membrane 113, thereby the probe card is completed.

The second embodiment (the second probe card) is effective when it is difficult to separate contact membranes 7 to form individual membranes 7 as in the first embodiment, due to high density arrays of semiconductor chips on a wafer.

INDUSTRIAL APPLICABILITY

The bumped membrane sheet and the probe card according to the present invention may be effectively used for inspection of a wafer by contacting the probe card with a large number of pins on the wafer simultaneously.

EXPLANATION OF THE REFERENCE NUMERALS

7 Contact membrane (membrane sheet with bumps)
17, 107 Bump
19, 109 Conductive electrode
35 Polyimide sheet (insulating sheet)
46 Electrode body
101 Bumped membrane (membrane sheet with bumps)
105 Polyimide sheet (insulating membrane)

What is claimed is:

1. A membrane sheet with bumps for a probe card, comprising:
    an insulating membrane made of polyimide;
    a bump formed from nickel and comprising a bottom face that faces a face of the insulating membrane and extending completely externally thereof so as to electrically contact with an electrode pad of a semiconductor chip formed on a wafer; and
    a conductive electrode having an upper face that faces the bottom face of the bump and that extends from the bump through the insulating membrane to a reverse face of the insulating membrane which is opposite the face of the insulating membrane;
    wherein a portion of the conductive electrode located between the face and the reverse face of the insulating membrane has a cross-section of a trapezoid that decreases in width toward the face of the insulating membrane, and
    wherein the bump has a triangular cross-section and wherein the bottom face of the bump is larger than the upper face of the conductive electrode such that an outer peripheral portion of the bottom face contacts and engages with the face of the insulating membrane so as to restrict the conductive electrode from movement in a direction toward the reverse face of the insulating membrane.

2. The membrane sheet with bumps for a probe card as set forth in claim 1, wherein the conductive electrode is provided with a reverse-face-side end portion which protrudes from the reverse face of the insulating membrane, the reverse-face-side end portion is formed larger than a bottom face of the portion of the conductive electrode located in the insulating membrane.

3. A probe card comprising:
    the membrane sheet with bumps as set forth in claim 1; and
    a wiring substrate provided with a terminal which is electrically connected with the conductive electrode of the membrane sheet with bumps.

4. The probe card as set forth in claim 3, wherein the membrane sheet with bumps has a size corresponding to that of the wafer.

5. The probe card as set forth in claim 3, further comprising a frame plate provided with a plurality of through-holes which correspond to the semiconductor chips,
    wherein the membrane sheet with bumps has a size corresponding to that of each of the through-holes, and is supported on a periphery of each of the through-holes on a face side of the frame plate.

6. The probe card as set forth in claim 5, further comprising an anisotropic conductive membrane comprising an elastic membrane which has a size corresponding to that of each of the through-holes, the elastic membrane being supported in the through-hole or on the periphery of each of the through-holes, and a plurality of conductive paths provided in the elastic membrane in electrically insulated relation to one another, the conductive paths extending in a thickness direction of the elastic membrane,
    wherein the conductive electrode and the terminal of the wiring substrate are electrically connected via each of the conductive paths.

7. A method for producing a membrane sheet with bumps for a probe card, the membrane sheet comprising an insulating membrane, a bump provided on a face of the insulating membrane so as to electrically contact with an electrode pad of a semiconductor chip formed on a wafer, the bump comprising a bottom face that faces the face of the insulating membrane, and a conductive electrode extending through the insulating membrane from the bump to a reverse face of the insulating membrane which is opposite the face of the insulating member, the method comprising the steps of:

preparing an insulating sheet made of polyimide for forming the insulating membrane;

forming a plating hole with a triangular cross-section within the insulating sheet from the reverse face of the insulating sheet by etching so as to correspond to the electrode pad of the semiconductor chip, a leading end of the plating hole not reaching a face of the insulating sheet;

forming an electrode body by plating the plating hole, the electrode body having a shape corresponding to a shape of the plating hole and including a lower end which forms the conductive electrode and an upper face of the conductive electrode facing the bottom face of the bump;

half-etching the insulating sheet from a face side thereof and exposing an upper end of the electrode body relative to the lower end which forms the conductive electrode from the insulating sheet, the upper end of the electrode body protruding with a shape having a triangular cross-section from the insulating sheet; and plating with nickel a surface of the upper end of the electrode body which protrudes with a shape having the triangular cross-section from the insulating membrane to form the bump, the bump including a bottom face that faces the face of the insulating membrane and follows the upper face of the conductive electrode, the bottom face of the bump being larger than the upper face of the conductive electrode such that an outer peripheral portion of the bottom face of the bump contacts and engages with the face of the insulating membrane so as to restrict the conductive electrode from movement in a direction toward the reverse face of the insulating membrane.

8. The method for producing a membrane sheet with bumps for a probe card as set forth in claim 7, wherein the bump has a triangular cross-section.

9. The method for producing a membrane sheet with bumps for a probe card as set forth in claim 7, wherein in forming the electrode body, the electrode body is formed so as to include a reverse-face-side end portion which protrudes from the reverse face of the insulating sheet, the reverse-face-side end portion is larger than a bottom face of a portion of the electrode body located in the insulating sheet.

10. The membrane sheet with bumps for a probe card as set forth in claim 1, wherein the bump is formed by plated upper end of the electrode body which protrudes from the insulating membrane and a plating thickness ranges from 5 μm to 10 μm.

11. A membrane sheet with bumps for a probe card, comprising:

an insulating membrane made of polyimide;

a bump formed from nickel and comprising a bottom face that faces a face of the insulating membrane so as to electrically contact with an electrode pad of a semiconductor chip formed on a wafer; and a conductive electrode having an upper face that faces the bottom face of the bump and that extends from the bump through the insulating membrane to a reverse face of the insulating membrane which is opposite the face of the insulating;

wherein a portion of the conductive electrode located between the face and the reverse face of the insulating membrane has a cross-section of a trapezoid that decreases in width toward the face of the insulating membrane, wherein the bump has a triangular cross-section and wherein the bottom face of the bump is larger than the upper face of the conductive electrode such that an outer peripheral portion of the bottom face of the bump contacts and engages with the face of the insulating membrane so as to restrict the conductive electrode from movement in a direction toward the reverse face of the insulating membrane, and wherein the portion of the conductive electrode located in the insulating membrane has a base diameter and a height and the base diameter is larger than the height.

12. The membrane sheet with bumps for a probe card as set forth in claim 10, wherein the portion of the conductive electrode located in the insulating membrane has a base radius and a height and the base radius is larger than the height.

\* \* \* \* \*